(12) United States Patent
Lee et al.

(10) Patent No.: US 6,528,118 B2
(45) Date of Patent: Mar. 4, 2003

(54) PROCESS FOR CREATING STRUCTURED POROSITY IN THERMAL BARRIER COATING

(75) Inventors: Ching-Pang Lee, Cincinnati, OH (US); Ramgopal Darolia, West Chester, OH (US); Robert Edward Schafrik, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 73 days.

(21) Appl. No.: 09/777,930

(22) Filed: Feb. 6, 2001

(65) Prior Publication Data

US 2002/0106457 A1 Aug. 8, 2002

(51) Int. Cl.[7] ................................................ C23C 14/04
(52) U.S. Cl. .................... 427/258; 427/282; 427/272; 427/456; 427/448; 427/596; 427/250; 427/252; 427/255.32; 427/255.7
(58) Field of Search ................... 427/456, 448, 427/596, 250, 252, 255.32, 255.7, 272, 282, 258

(56) References Cited

U.S. PATENT DOCUMENTS 5,756,217 A  *  5/1998  Schroder et al. ............ 428/148
6,316,078 B1 * 11/2001  Smialek ................... 427/248.1

* cited by examiner

*Primary Examiner*—Timothy Meeks
(74) *Attorney, Agent, or Firm*—McNees Wallace & Nurick LLC; K. Scott O'Brian; Carmen Santa Maria

(57) ABSTRACT

A process for creating microgrooves within or adjacent to a TBC layer applied to a gas turbine engine component such as a blade or vane. The process includes the steps of applying a bond coat to the surface of the substrate. A wire mesh is placed a predetermined distance above the bond coat surface. With the wire mesh in position, about 0.002 inches of an inner TBC is applied over the bond coat. The wire in the wire mesh causes a shadow effect as the TBC is applied, so that there are variations in the thickness of the applied TBC, forming micro channels. The wire mesh is removed and an additional outer TBC layer is applied over the inner TBC layer, and the variations in thickness are bridged by the continued deposition of the columnar TBC over the inner TBC layer, forming the microgrooves.

19 Claims, 2 Drawing Sheets

PROCESS FOR CREATING STRUCTURED POROSITY IN THERMAL BARRIER COATING

FIELD OF THE INVENTION

This invention relates generally to gas turbine engines, and in particular. to a cooled flow path surface region.

CROSS-REFERENCE TO RELATED APPLICATIONS

This application references co-pending applications assigned to the assignee of the present invention, which are identified as Ser. No. 09/707,023 entitled "Directly Cooled Thermal Barrier Coating System", Ser. No. 09/707,027 entitled "Transpiration Cooling in Thermal Barrier Coating" and Ser. No. 09/707,024 entitled "Multi-layer Thermal Barrier Coating with Integrated Cooling System," the contents of which are incorporated herein by reference.

BACKGROUND OF THE INVENTION

In gas turbine engines, for example, aircraft engines, air is drawn into the front of the engine, compressed by a shaft-mounted rotary-type compressor, and mixed with fuel. The mixture is burned, and the hot exhaust gases are passed through a turbine mounted on a shaft. The flow of gas turns the turbine, which turns the shaft and drives the compressor and fan. The hot exhaust gases flow from the back of the engine, driving it and the aircraft forward.

During operation of gas turbine engines, the temperatures of combustion gases may exceed 3,000° F., considerably higher than the melting temperatures of the metal parts of the engine, which are in contact with these gases. Operation of these engines at gas temperatures that are above the metal part melting temperatures is a well established art, and depends in part on supplying cooling air to the metal parts through various methods. The metal parts of these engines that are particularly subject to high temperatures, and thus require particular attention with respect to cooling, are the metal parts forming combustors and parts located aft of the combustor including turbine blades and vanes and exhaust nozzles.

The hotter the turbine inlet gases, the more efficient is the operation of the jet engine. There is thus an incentive to raise the turbine inlet gas temperature. However, the maximum temperature of the turbine inlet gases is normally limited by the materials used to fabricate the components downstream of the combustors such as the vanes and the blades of the turbine. In current engines, the turbine vanes and blades are made of nickel-based superalloys, and can operate at temperatures of around 2100° F.

The metal temperatures can be maintained below melting levels with current cooling techniques by using a combination of improved cooling designs and thermal barrier coatings (TBCs). For example, with regard to the metal blades and vanes employed in aircraft engines, some cooling is achieved through convection by providing passages for flow of cooling air from the compressor internally within the blades so that heat may be removed from the metal structure of the blade by the cooling air. Such blades have intricate serpentine passageways within the structural metal forming the cooling circuits of the blade.

Small internal orifices have also been devised to direct this circulating cooling air directly against certain inner surfaces of the airfoil to obtain cooling of the inner surface by impingement of the cooling air against the surface, a process known as impingement cooling. In addition, an array of small holes extending from a hollow core through the blade shell can provide for bleeding cooling air through the blade shell to the outer surface where a film of such air can protect the blade from direct contact with the hot gases passing through the engine, a process known as film cooling.

In another approach, a thermal barrier coating (TBC) is applied to the turbine blade component, which forms an interface between the metallic component and the hot gases of combustion. The TBC includes a ceramic coating that is applied to the external surface of metal parts to impede the transfer of heat from hot combustion gases to the metal parts, thus insulating the component from the hot combustion gas. This permits the combustion gas to be hotter than would otherwise be possible with the particular material and fabrication process of the component.

TBCs include well-known ceramic materials, for example, yttrium-stabilized zirconia (YSZ). Ceramic TBCs usually do not adhere well directly to the superalloys used as substrate materials. Therefore, an additional metallic layer called a bond coat is placed between the substrate and the TBC. The bond coat may be made of a nickel-containing overlay alloy, such as a MCrAlY, where M is an element selected from the group consisting of Ni, Co, Fe and combinations thereof, or other compositions more resistant to environmental damage than the substrate. Alternatively, the bond coat may be a diffusion nickel aluminide or platinum aluminide, which is grown into the surface of the substrate and whose surface oxidizes to form a protective aluminum oxide scale that provides improved adherence of the ceramic top coatings. The bond coat and overlying TBC are frequently referred to as a thermal barrier coating system.

In an effort to improve TBC life, U.S. Pat. No. 5,419,971 to Skelly et al., assigned to the assignee of the present invention, is directed to small grooves placed in the bond coat layer and/or an interfacial layer lying between the substrate and the TBC to minimize spallation resulting from propagation of cracks formed in TBC systems. The grooves are formed by an ablation process using an ultraviolet laser such as an excimer laser. These grooves have been demonstrated to improve TBC life by facilitating the formation of desired TBC microstructure, which arrests the propagation of cracks formed within TBC, thereby reducing the incidence of spallation, defined as the chipping or flaking away of the coating.

Attempts to improve the life of the bond coat include U.S. Pat. No. 5,034,284 to Bornstein et al. which discloses a porous strain isolation layer placed between the substrate and the bond coat. The porous layer is formed by spraying a mixture of alloy and polymer particles with subsequently heating to eliminate the polymer. The pores are in a random pattern and do not create channels.

The three co-pending applications referenced above disclose small cooling or micro channels within or near the bond coat to improve bond coat and/or TBC system life. These micro channels may communicate directly with at least one cooling circuit contained within the component from which they receive cooling air, thereby providing direct and efficient cooling for the TBC system. To form these micro channels, a surface is masked with a masking material, the masking material forming a pattern on the surface overlying at least one cooling fluid supply contained within the component. The masking material is subsequently removed, leaving hollow micro channels to actively cool the flow path surface region, thus achieving a better, more efficient engine performance.

Creating micro grooves with an excimer laser is a slow and expensive process. Utilizing a masking material which must later be removed also adds additional time and expense. Thus, there is an ongoing need for improved methods for economically creating micro grooves or channels used to encourage favorable microstructure formation and/or improve the environmental resistance and long-term stability of the thermal barrier coating system, so that higher engine efficiencies can be obtained. The present invention fulfills this need, and further provides related advantages.

SUMMARY OF THE INVENTION

The present invention provides an improved method for creating micro grooves or channels within or adjacent to the TBC layer applied to a gas turbine engine component, for example, a blade or vane.

In one embodiment, a substrate surface is first coated with a bond coat, for example, an approximately 0.002" thick diffusion PtAl or an overlay NiAl based alloy coating. A wire mesh is placed a predetermined distance above the bond coat surface, and an inner TBC layer, approximately 0.002" thick is then deposited on top of the bond coat. The wires in the mesh shadow the TBC deposition, forming structured grooves on the TBC surface. The wire mesh is then removed and an additional, outer, TBC is deposited.

The screen is removed while the shadow-formed grooves are relatively shallow. Subsequent electron beam evaporation physical vapor deposition (EB-PVD) TBC coating is then applied to achieve the microstructure described in the above referenced U.S. Pat. No. 5,419,971, assigned to the assignee of the present invention, incorporated by reference in its entirety herein.

In a different embodiment, the EB-PVD process is used to deposit an outer TBC, for example, a porous, columnar TBC microstructure over an inner TBC, using a screen so as to form channels at the interface between the inner and outer TBC. After grooves are created at the interface, the screen is removed and deposition of the outer TBC is completed, leaving channels in the outer TBC, in a manner similar to that previously set forth above. The composition and microstructure of the outer TBC layer may be different from the inner TBC, and thus controlled as required. The mesh size and wire diameter of the mesh design of the screen may be varied, as can the distance between the bond coat and screen, along with the motion of the screen in the X and Y directions, so as to create shadowed channels/voids of varying geometry.

When placed adjacent to or within a porous TBC, the micro channels provide both active and transpiration cooling through the porous TBC. The micro channels are placed to communicate directly with at least one cooling circuit contained within component from which they receive cooling air, thereby providing direct and efficient cooling for the TBC system. The result is a substrate having an actively cooled flow path surface region that can reduce the cooling requirement for the substrate. Therefore, the engine can run at a higher firing temperature without the need for additional cooling air, achieving a better, more efficient engine performance.

The present invention further comprises the cooled flow path surface region of a component formed by the foregoing methods and the turbine component with the patterned micro channels and/or structured grooves formed by the foregoing methods for cooling the component and/or arresting the propagation of cracks within the TBC.

One advantage of the present invention is that because the wire mesh can be cleaned and reused repeatedly, the wire mesh shadowing technique disclosed is more economical than the laser grooving technique.

Yet another advantage is that the wire size and mesh density can be varied to easily control the size and shape of the structured grooves best suited for various requirements and applications. For example, the structured grooves may be made small enough to act not as cooling channels, but rather as controlled porosity to reduce thermal conductivity, and delay the propagation of TBC spallation; or, alternatively, cooling channels with differing sizes and geometric cross sections may be easily obtained.

Still another advantage is the composition and microstructure of the TBC is easily varied to suit specific requirements and applications. For example, when micro channels are formed (as discussed below), cooling air supplied to these micro channels can provide a direct cooling to the TBC and bond coat to improve the TBC life. By controlling the outer TBC porosity, cooling air will also flow through the porosity inside the ceramic layer to provide transpiration cooling.

Other features and advantages of the present invention will be apparent from the following more detailed description of the preferred embodiment, taken in conjunction with the accompanying figures which illustrate, by way of example, the principles of the invention.

DETAILED DESCRIPTION OF THE PREFERRED EMBODIMENTS

The present invention sets forth the processes of producing structured grooves used to create micro channels for cooling hot spots on any turbine engine hot section components, such as turbine blades, turbine vanes, nozzles, combustors and the like, and for inhibiting the propagation of cracks formed within the TBC, thereby reducing the incidence of TBC spallation and increasing component service life.

Substrate materials often used in turbine parts or airfoils for aircraft engines and power generation equipment may include nickel, cobalt, or iron based superalloys. The alloys may be cast or wrought superalloys. Examples of such substrates are GTD-111, GTD-222, René 80, René 41, René 125, René 77, René N4, René N5, René N6, $4^{th}$ generation single crystal superalloy MX-4, Hastelloy X, and cobalt-based HS-188.

Figure 1:
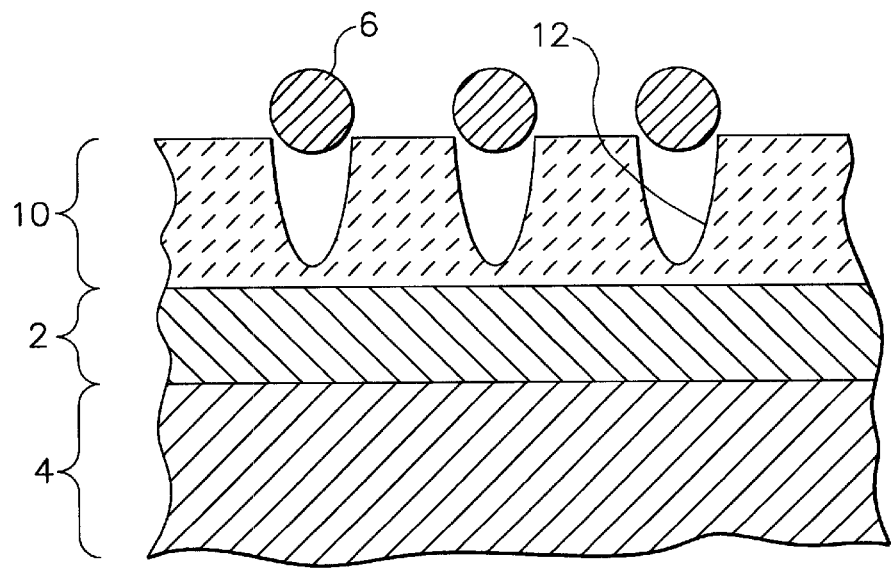
FIG. 1 is a representation of a cross section view showing the shadowing effect of the wire mesh on the inner TBC.

Referring to FIG. 1, a bond coat 2 is applied to the substrate 4 using known techniques to a thickness of about 0.0005 inch to about 0.05 inch, preferably about 0.002 inch in thickness. The bond coat 2 may be, for example, a diffusion aluminide, such as NiAl or PtAl base alloy formed to the appropriate thickness by, for example, vapor phase aluminiding (VPA) or chemical vapor deposition (CVD), or it may be a MCrAl(X) where M is an element selected from the group consisting of Fe, Co and Ni and combinations thereof and (X) is an element selected from the group of gamma prime formers, solid solution strengtheners, consisting of, for example, Ta, Re and reactive elements, such as Y, Zr, Hf, Si, and grain boundary strengtheners consisting of B, C and combinations thereof.

Bond coats such as MCrAl(X)s are known to be applied by physical vapor deposition (PVD) processes such as electron beam evaporation (EB), ion-plasma arc evaporation, sputtering, or by thermal spray processes such as air plasma spray (APS), high velocity oxy-fuel (HVOF) or low pressure plasma spray (LPPS) where temperatures can be 1800° F. or higher. PVD processes are applied in a vacuum, while thermal sprays can be controlled so as to be applied under non-oxidizing conditions.

Figure 2:
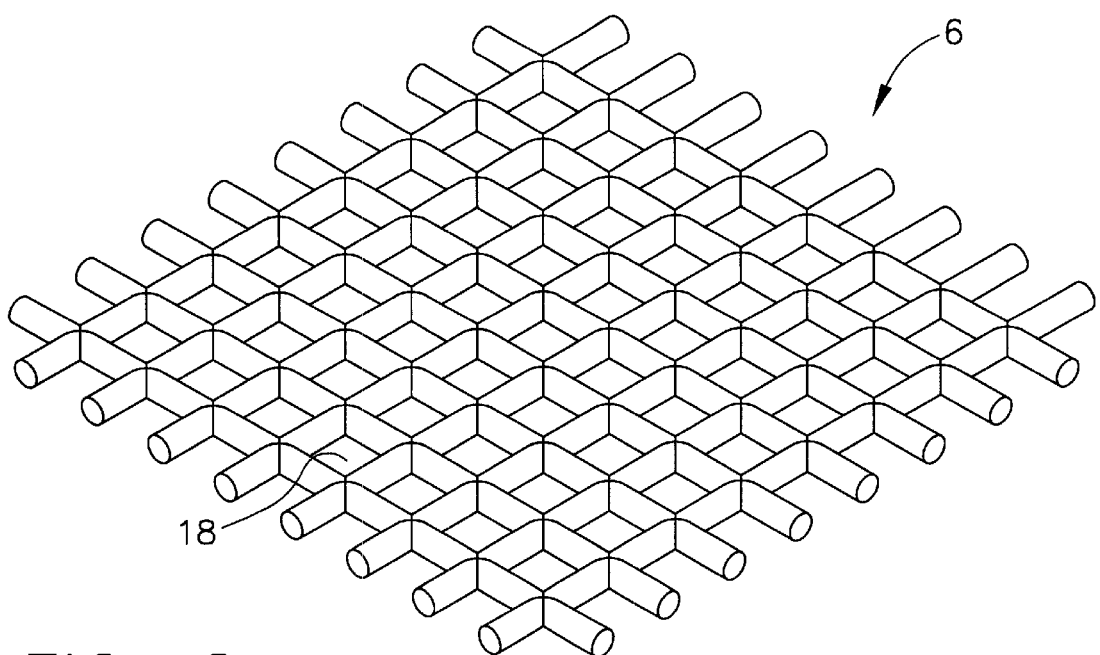
FIG. 2 is a representation of the wire mesh.

After the bond coat has been deposited, a wire mesh 6, for example, as displayed in FIG. 2, is placed above the bond coat surface a distance of about 0.002 inch to about 0.005 inch. When active cooling is desired, the mesh is positioned such that at least one portion of the mesh overlies an exit orifice of a cooling fluid supply (not shown), for example, cooling circuits contained within the turbine engine component. In this manner, the resultant micro channels 8 (described below) will communicate with the cooling fluid supply.

The mesh 6 is manufactured from materials that will withstand temperatures in excess of 2000° F., for example, refractory materials such as tungsten or ceramic materials such as $Al_2O_3$. The diameter of the wire used to manufacture the mesh 6 is of a preselected size, typically about 0.001 inch to about 0.003 inch. The mesh size 18 (also referred to as mesh density), defined as the area between the wires, must not be so large as to prevent adequate cooling by the resultant micro channels. Ideally, the mesh size 18 is, for example, between about two wire diameters to about five wire diameters, as measured from wire center to wire center.

Following placement of the wire mesh 6, an inner TBC layer 10 of predetermined thickness, typically about 0.002 inch, is deposited on top of the bond coat 2 using known techniques, for example, EB-PVD. As the inner TBC 10 is deposited upon the bond coat 2, structured grooves 12 are formed within the depositing inner TBC 10 and over the bond coat 2 due to the shadowing effect of the wire mesh 6. The shadowing effect may be best visualized by placing an object in front of a light source and observing the shadow cast by that object. Light rays passing around the object would represent TBC being deposited, while the shadow cast by the object would represent the void in the deposited TBC. It is this void which ultimately forms the structured grooves.

The wire mesh 6 determines the configuration of the structured grooves 12. For example, the wire mesh design (the mesh size and wire diameter) determines the internal dimensions of and the spacing between the resultant structured grooves 12. Although illustrated as a grid, it should be appreciated other physical forms may be utilized, for example, serpentine rows or random patterns. By manipulating the mesh 6 during TBC deposition, the geometric pattern of the resultant structure is determined. For example, by varying the distance between the bond coat 2 and the mesh 6, and/or moving the mesh 6 in the X and Y directions during TBC deposition, structured grooves 12 of varying geometry are obtained. The cross section of the structured grooves 12 may assume any geometric form, for example, a rectangle, a circle, a triangle or any other shape that will facilitate the flow of cooling fluid.

Figure 3:
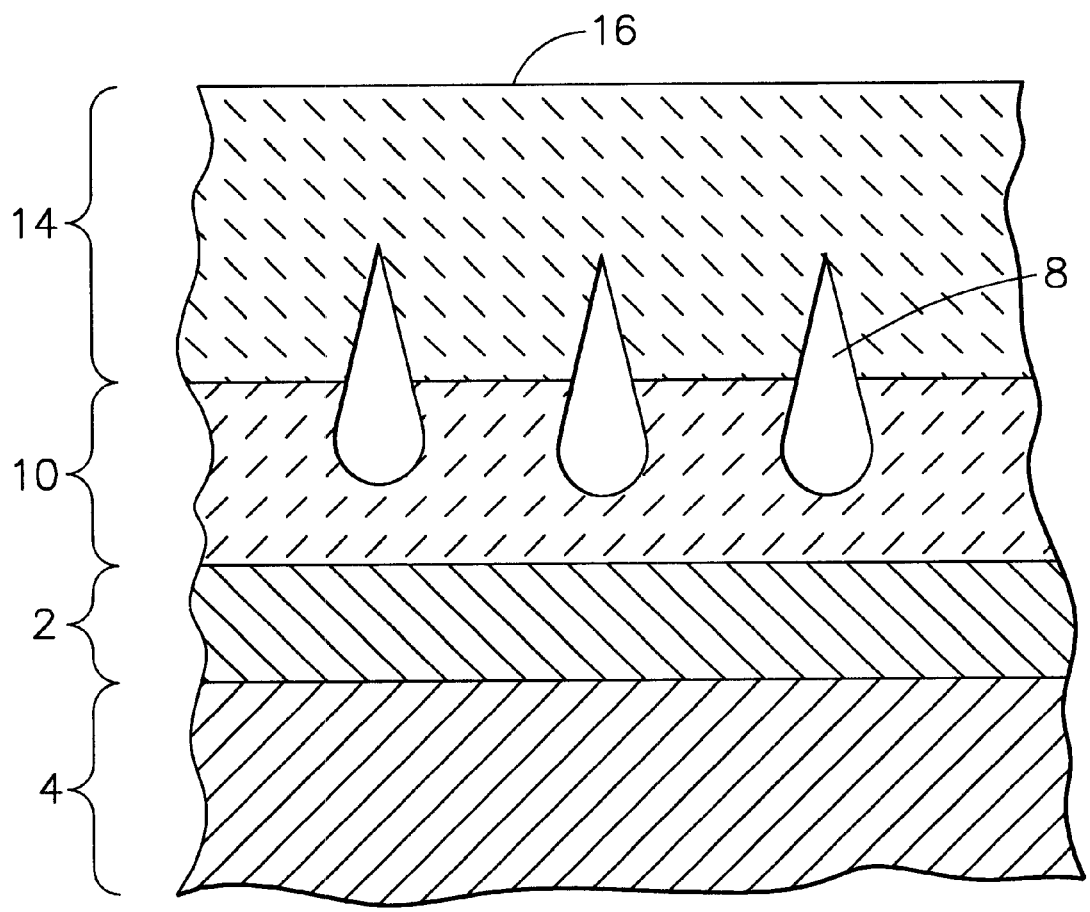
FIG. 3 is a representation of a cross section view showing one form of the TBC system formed by the method of the present invention.

After the inner layer of TBC 10 has been deposited, the wire mesh 6 is removed, and a second, outer layer of TBC 14 (FIG. 3) is deposited using known methods, for example, EB-PVD to a predetermined thickness, typically about 0.002–0.050 inches. The preferred thickness is about 0.002–0.020 inches, and the most preferred range of thicknesses is from about 0.002–0.010 inches. As the second, outer layer of TBC 14 is deposited, it does not completely fill the structured groove 12 thereby creating, for example, a micro channel 8. The EB-PVD process employs a line-of-sight targeting regime so that the deposition angle results in a shadowing effect. This shadowing effect, along with the growth of the TBC as a columnar structure and the rate of growth of this structure, each contribute to the structured groove not being filled by the material deposition process, resulting in the micro channel 8. Although depicted in FIG. 3 as teardrop in cross-section, the cross section of the micro channel 8 may take any preselected form such as a parallelogram, rectangle, an oval, a triangle or a circle.

Cooling fluid may thereby be routed from an engine cooling fluid supply through channels into at least one micro channel 8, for example, as described in the co-pending application identified as Attorney Docket No. 13DV-13513 entitled "Directly Cooled Thermal Barrier Coating System". After passage through the micro channel, the cooling fluid, which is at an elevated temperature, is expelled, typically into the gas stream from combustion. In this manner, the bond coat is kept at a reduced temperature through active convection cooling.

The second, outer TBC layer 14 may be a porous TBC layer as described in the co-pending application identified as Attorney Docket No. 13DV-13528 entitled "Transpiration Cooling in Thermal Barrier Coating". In this manner, the composition and microstructure of the outer TBC layer can be different from the inner TBC, and thus controlled as required. Micro channels 8 formed at the interface of the inner TBC layer 10 and the outer TBC layer 14 can therefore allow for both active convection cooling as described above and transpiration cooling through a porous TBC layer as described in the above referenced co-pending application.

The method of the present invention may also be utilized as described in a co-pending application identified as Attorney Docket No. 13DV-13527 entitled "Multi-layer Thermal Barrier Coating with Integrated Cooling System", in which the TBC is processed to have a varying density, and hence variable porosity. In this manner, cooling fluid is allowed to flow through the inner TBC micro channels 8 and further spread through the outer TBC layer 14, providing transpiration cooling before exiting to the outer TBC surface 16 or flow through discrete holes, thereby providing film cooling, or both.

In a different embodiment, the wire mesh 6 is removed early in the inner TBC shadowing process while the structured grooves 12 are relatively shallow, for example, 0.0005–0.0015 inches in depth. Subsequent outer TBC 14 is then applied, for example, to a depth of about 0.002–0.050 inches in its broadest embodiment, although the preferred thickness is about 0.002–0.020 inches, and the most preferred range is about 0.003–0.010 inches. Because the structured grooves 12 are shallow, upon deposition of the outer TBC 14, rather than formation of micro channels 8, a pre-selected, controllable pattern of three-dimensional features is formed. These three dimensional features act as obstacles to TBC crack formation by deflecting a propagating crack tip and causing it to pass through phase boundaries which impede the progress of the crack. The benefits of these pre-selected, controllable patterns of three-dimensional features are more fully explained in U.S. Pat. No. 5,419,971, referenced above.

The present invention also comprises the thermal barrier coating system formed by the above-described methods and the turbine component with the patterned micro channels and/or structured grooves formed by the foregoing methods.

Although the present invention has been described in connection with specific examples and embodiments, those skilled in the art will recognize that the present invention is capable of other variations and modifications within its scope. For example, while the shadowing technique of the present invention has been described in depositing the inner TBC layer, this method will work equally well during deposition of other material, for example, deposition of the bond coat by, for example, EB-PVD, CVD or VPA to obtain structured grooves within the bond coat. In this manner, micro channels for active convection and/or transpiration cooling may be located adjacent to or within the bond coat, followed by deposition of a subsequent TBC using known methods, for example EB-PVD.

These examples and embodiments are intended as typical of, rather than in any way limiting on, the scope of the present invention as presented in the appended claims.

What is claimed is:

1. A method of creating structured porosity in a thermal barrier coating comprising the steps of:
    placing a mesh at a predetermined distance above a first surface;
    applying a first material to the first surface such that the mesh causes a shadow effect on the first material, forming at least one groove of preselected structure with the first material;
    removing the mesh; and
    applying a second material to the first material such that the structured groove enclosed by the applied materials becomes a structured porosity.

2. The method of claim 1 wherein the mesh is comprised of materials capable of temperatures greater than 2000° F.

3. The method of claim 1 wherein the mesh has a form selected from the group consisting of a grid and serpentine rows.

4. The method of claim 3 wherein the mesh is positioned such that at least one portion of the mesh overlies an exit orifice of a cooling fluid supply to provide communication between the cooling fluid supply and the structured porosity.

5. The method of claim 1 wherein the mesh is comprised of a wire having a diameter of about 0.001 inch to about 0.003 inch, a mesh size of at least about 2 wire diameter to about 5 wire diameter as measured from wire center to wire center, the mesh being positioned above the first surface a distance of about 0.002 inch to about 0.005 inch.

6. The method of claim 1 further comprising the step of manipulating the mesh having a preselected two dimensional pattern extending in an X direction and a Y direction in at least one direction during application of the first material to obtain a structured groove of predetermined geometry.

7. The method of claim 1 wherein the structured porosity forms a micro channel.

8. The method of claim 1 wherein the structured porosity is a pre-selected, controllable pattern of three-dimensional features for inhibiting crack propagation.

9. The method of claim 1 wherein the first surface is a substrate, the first material is a bond coat and the second material is a thermal barrier coating.

10. The method of claim 9 wherein the substrate is selected from the group consisting of nickel, cobalt and iron based superalloys and the bond coat is selected from the group consisting of a diffusion PtAl, a NiAl and a MCrAl(X) where M is an element selected from the group consisting of Fe, Co and Ni and combinations thereof and X is an element selected from the group consisting of reactive elements, solid solution strengtheners, grain boundary strengtheners, gamma prime formers and combinations thereof.

11. The method of claim 10 wherein an element selected from the group consisting of reactive elements further includes an element selected from the group consisting of Y, Zr, Hf, Si and combinations thereof.

12. The method of claim 10 wherein an element selected from the group consisting of solid solution strengtheners further includes an element selected from the group consisting of Ta, Re and combinations thereof.

13. The method of claim 10 wherein an element selected from the group consisting of grain boundary strengtheners further includes an element selected from the group consisting of B, C and combinations thereof.

14. The method of claim 1 wherein the first surface is a bond coat, the first material is an inner thermal barrier coating and the second material is an outer thermal barrier coating.

15. The method of claim 14 wherein the bond coat is selected from the group consisting of a diffusion PtAl, a NiAl and a MCrAl(X) where M is an element selected from the group consisting of Fe, Co and Ni and combinations thereof and X is an element selected from the group consisting of reactive elements, solid solution strengtheners, grain boundary strengtheners, gamma prime formers and combinations thereof.

16. The method of claim 14 wherein the bond coat is applied to a thickness of about 0.0005 inch to about 0.05 inch.

17. The method of claim 14 wherein the inner thermal barrier coating is about 0.002 inch in thickness.

18. A method for creating structured porosity in a thermal barrier coating comprising the steps of:
    applying a bond coat to a substrate;
    placing a mesh above the bond coat;
    applying an inner thermal barrier coating to the bond coat such that the mesh causes a shadow effect on the inner thermal barrier coating, forming at least one structured groove on the surface of the inner thermal barrier coating;
    removing the mesh; and
    applying an outer thermal barrier coating over to the inner thermal barrier coating such that the at least one structured groove becomes a structured porosity.

19. The method of claim 18 further comprising the step of manipulating the mesh having a preselected two dimensional pattern extending in an X direction and a Y direction in at least one direction during application of the inner TBC to obtain a structured groove of predetermined geometry.

* * * * *

UNITED STATES PATENT AND TRADEMARK OFFICE
CERTIFICATE OF CORRECTION

PATENT NO.     : 6,528,118 B2  
DATED          : March 4, 2003  
INVENTOR(S)    : Ching-Pang Lee, Ramgopal Darolia and Robert Edward Schafrik It is certified that error appears in the above-identified patent and that said Letters Patent is hereby corrected as shown below:

Column 2,
Line 53, delete "subsequently" should read -- subsequent --.

Signed and Sealed this

Fourth Day of November, 2003

JAMES E. ROGAN
*Director of the United States Patent and Trademark Office*